(12) United States Patent
Fukui et al.

(10) Patent No.: US 6,382,502 B1
(45) Date of Patent: May 7, 2002

(54) METHOD OF MANUFACTURING A HEAT SINK MADE OF ALUMINUM

(75) Inventors: Koichiro Fukui, Tochigi; Shunta Ushioda, Ibaraki; Ichizo Tsukuda, Osaka, all of (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/521,230

(22) Filed: Mar. 8, 2000

(30) Foreign Application Priority Data

Mar. 26, 1999 (JP) .......................................... 11-083132

(51) Int. Cl.⁷ ........................... B23K 35/38; B23K 31/02
(52) U.S. Cl. .................... 228/222; 228/120; 228/232.2; 228/234.1
(58) Field of Search ................................ 228/222, 102, 228/120, 175, 178, 199, 200, 233.2, 234.1, 262.9

(56) References Cited

U.S. PATENT DOCUMENTS

| | | | | |
|---|---|---|---|---|
| 4,019,931 A | * | 4/1977 | Setzer et al. ............... | 148/11.5 |
| 4,214,925 A | * | 7/1980 | Arita et al. .................. | 148/127 |
| 5,616,189 A | * | 4/1997 | Jin et al. ..................... | 148/549 |
| 5,681,407 A | * | 10/1997 | Yu et al. ...................... | 148/633 |
| 5,728,479 A | * | 3/1998 | Childree et al. ............. | 428/654 |
| 5,810,949 A | * | 9/1998 | Chakrabarti et al. ......... | 148/535 |
| 5,820,015 A | * | 10/1998 | Childree ..................... | 228/206 |
| 5,894,054 A | * | 4/1999 | Paruchuri et al. ........... | 428/642 |
| 6,120,848 A | * | 9/2000 | Van Evans et al. ......... | 427/359 |

FOREIGN PATENT DOCUMENTS

JP          357122551 A  *  7/1982

* cited by examiner

*Primary Examiner*—M. Alexandra Elve
*Assistant Examiner*—Zidia Pittman

(57) ABSTRACT

A heat sink made of aluminum having both high strength and heat dissipation performance together is manufactured.

In a method of manufacturing a heat sink made of aluminum by brazing a plurality of fins 13 on a heat dissipating substrate 11, the fin 13 comprises an Al—Mg—Si series alloy containing from 0.3 to 0.7% by weight of Mg, from 0.3 to 0.7% by weight of Si and the balance of Al and inevitable impurities, and is put to cooling at a rate of 50° C./min or more in a range from 450–500° C. to 300° C. in the cooling process after heating for brazing and, subsequently, artificial aging is applied at 100 to 250° C.

9 Claims, 2 Drawing Sheets

METHOD OF MANUFACTURING A HEAT SINK MADE OF ALUMINUM

BACKGROUND OF THE INVENTION

1. Field of the Invention

This invention concerns a method of manufacturing a heat sink made of aluminum in which a plurality of fins are brazed on a heat dissipating substrate.

2. Related Art Statement

In electronic equipments such as computers and NC control equipments, many heat generating devices are incorporated and various kinds of heat dissipating members are used in order to rapidly release the generated heat and maintain the normal operation for a long time. A heat sink made of aluminum in which a plurality of thin plate-like fins are attached on a heat dissipating substrate is one of such heat dissipating members. Further, in view of the material, 1000 series aluminum excellent particularly in thermal conductivity is often used and 3000 series or 5000 series aluminum is used in the case of requiring high strength.

Further, in the heat sink of the shape described above, it is important to enlarge the heat dissipating area in order to improve the heat dissipating performance and, for this purpose, it is necessary to reduce the thickness of the fins and narrow the distance between the fins thereby increase the number of fins.

However, since 3000 series or 5000 series aluminum is inferior in the thermal conductivity to 1000 series aluminum, heat sinks in which fins of a reduced thickness are formed of such materials for ensuring the strength involve a problem in the heat dissipating performance. Further, when the fins of reduced thickness are formed of 1000 series aluminum having good thermal conductivity, they result in a problem that they are liable to be broken by vibrations or impacts upon handling.

SUMMARY OF THE INVENTION

An object of this invention is to provide a method of manufacturing a heat sink made of aluminum having both high strength and heat dissipating performance together in view of the back ground art as described above.

For attaining the foregoing object, this invention provides a method of manufacturing a heat sink made of aluminum by brazing a plurality of fins 13 on a heat dissipating substrate 11, in which the fin 13 comprises an Al—Mg—Si series alloy containing from 0.3 to 0.7% by weight of Mg, from 0.3 to 0.7% by weight of Si and the balance of Al and inevitable impurities, cooling is conducted in a cooling process after heating for brazing at a rate of 50° C./min or higher in a range from 450–500° C. to 300° C. and then artificial aging is applied at 100 to 250° C.

The Mg content in the Al—Mg—Si series alloy constituting the fin 13 is preferably from 0.4 to 0.6% by weight.

The Si content in the Al—Mg—Si series alloy constituting the fin 13 is preferably from 0.4 to 0.6% by weight.

Further, cooling after the heating for brazing is preferably conducted at a rate of 75° C./min or higher.

Further, the artificial aging is applied preferably at 160 to 220° C.

Further, brazing between the heat dissipating substrate 11 and a plurality of fins 13 are preferably conducted by using an Al—Si series alloy brazing material and a chloride series flux in an inert gas atmosphere while heating at 577 to 610° C.

BRIEF DESCRIPTION OF THE ACCOMPANYING DRAWINGS

FIG. 2A shows an example of assembling a heat sink in which a spacer plate is interposed between each of the adjacent fins.

DESCRIPTION OF PREFERRED EMBODIMENTS

Figure 1:
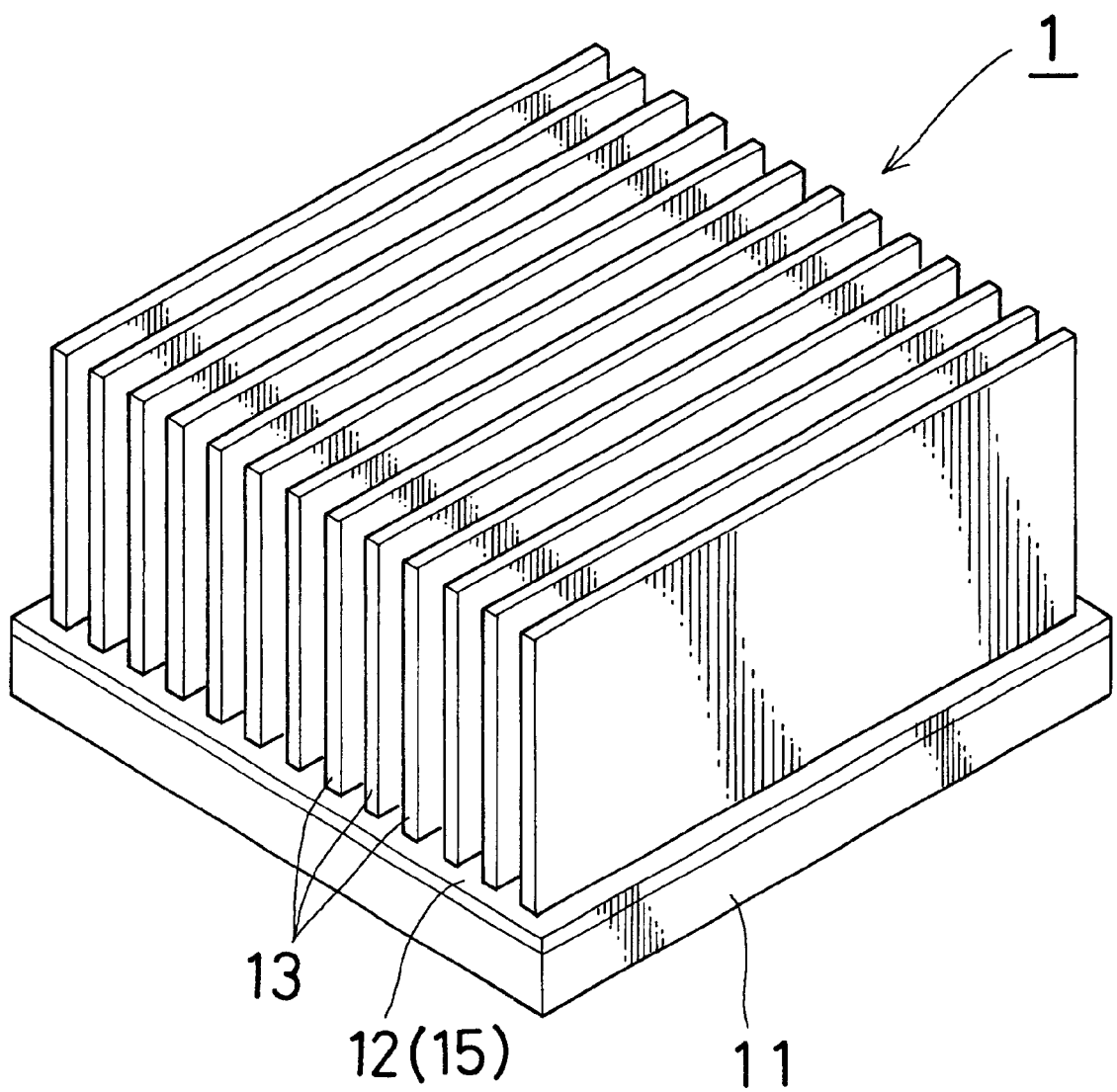
FIG. 1 is a perspective view of a heat sink manufactured by a method according to this invention.

The chemical composition for the Al—Mg—Si series alloy used as the material of the fin 13 is defined for ensuring the strength and the thermal conductivity in this invention. The purpose for the addition of each element and the reason of defining the contents thereof are to be explained below.

Mg and Si are elements necessary for the improvement of the strength and they develop strength by the precipitation of $Mg_2Si$. No sufficient strength can be obtained when the Mg content is less than 0.3% by weight or the Si content is less than 0.3% by weight since less $Mg_2Si$ is formed. On the other hand, if the Mg content exceeds 0.7% by weight, and the Si content exceeds 0.7% by weight, the material becomes brittle making it difficult to fabricate into a sheet-like fin and the thermal conductivity is also lowered. A preferred lower limit is 0.4% by weight and a preferred upper limit is 0.6% by weight for each of the Mg content and the Si content.

The material for the heat dissipating substrate 11 is aluminum or an alloy thereof, with no particular restriction, so long as the material provides strength and heat dissipation performance as the substrate. While the thickness is not particularly defined for the heat dissipating substrate 11 or the fin 13 in this invention, a plate usually having a larger thickness than that of the fin 13 is often used for the heat dissipating substrate 11, and pure aluminum with low strength can also be used only considering the property of the thermal conductivity if the material is so thick as not causing problems in view of the material strength. Further, when the heat dissipating substrate is formed into a thin plate, strength can be ensured by using the same Al—Mg—Si series alloy as that of the fin material.

Further, while the brazing conditions other than the cooling rate and the aging treatment are not restricted in this invention, the following conditions are recommended based on the material of the fin 13.

For the brazing material, an Al—Si series alloy brazing material suitable to brazing of Al—Mg—Si series alloy is preferably used.

Further, as to the heating for brazing, brazing in an inert gas atmosphere using a chloride series flux is recommended. Use of the fluoride series flux is not favorable since Mg contained in the fin material reacts with F in the flux to possibly hinder the brazing. Further, vacuum brazing is not preferred since Mg in the fin may possibly be decreased.

The brazing temperature is preferably from 577 to 610° C. in view of the composition of the fin material and the brazing material. This is because flow of flux is poor at a temperature below 577° C., while molten brazing material causes corrosion of the matrix material at a temperature exceeding 610° C. A preferred brazing temperature is from 590 to 600° C.

In the cooling after brazing, it is necessary to conduct rapid cooling at a rate of 50° C./min or higher in a range from 450–500° C. to 300° C. in order to maintain the solid solubilized state of $Mg_2Si$ till a normal temperature. When the cooling rate in this range is less than 50° C./min, hardening is not obtained even by the subsequent aging treatment. A preferred cooling rate is 75° C./min or higher.

Further, improvement of the strength by hardening is intended by applying artificial aging at 100 to 250° C. When the processing temperature is lower than 100° C. or exceeding 250° C., hardening does not occur and the strength is not improved. A preferred lower limit is 160° C. and a preferred upper limit is 220° C. for the processing temperature. Further, the processing time is preferably from 6 to 10 hours for attaining sufficient hardening and avoiding lowering of the strength by over aging.

When the heat dissipating substrate 11 and the fins 13 are assembled, it is desirable to form a spacer plate of a thickness corresponding to the gap between each of the adjacent fins with stainless steel or the like and interpose the spacer plate between the fins. By the use of the spacer plates, fins can be assembled exactly and easily even in the case where the distance between them is narrow.

Figure 2B:
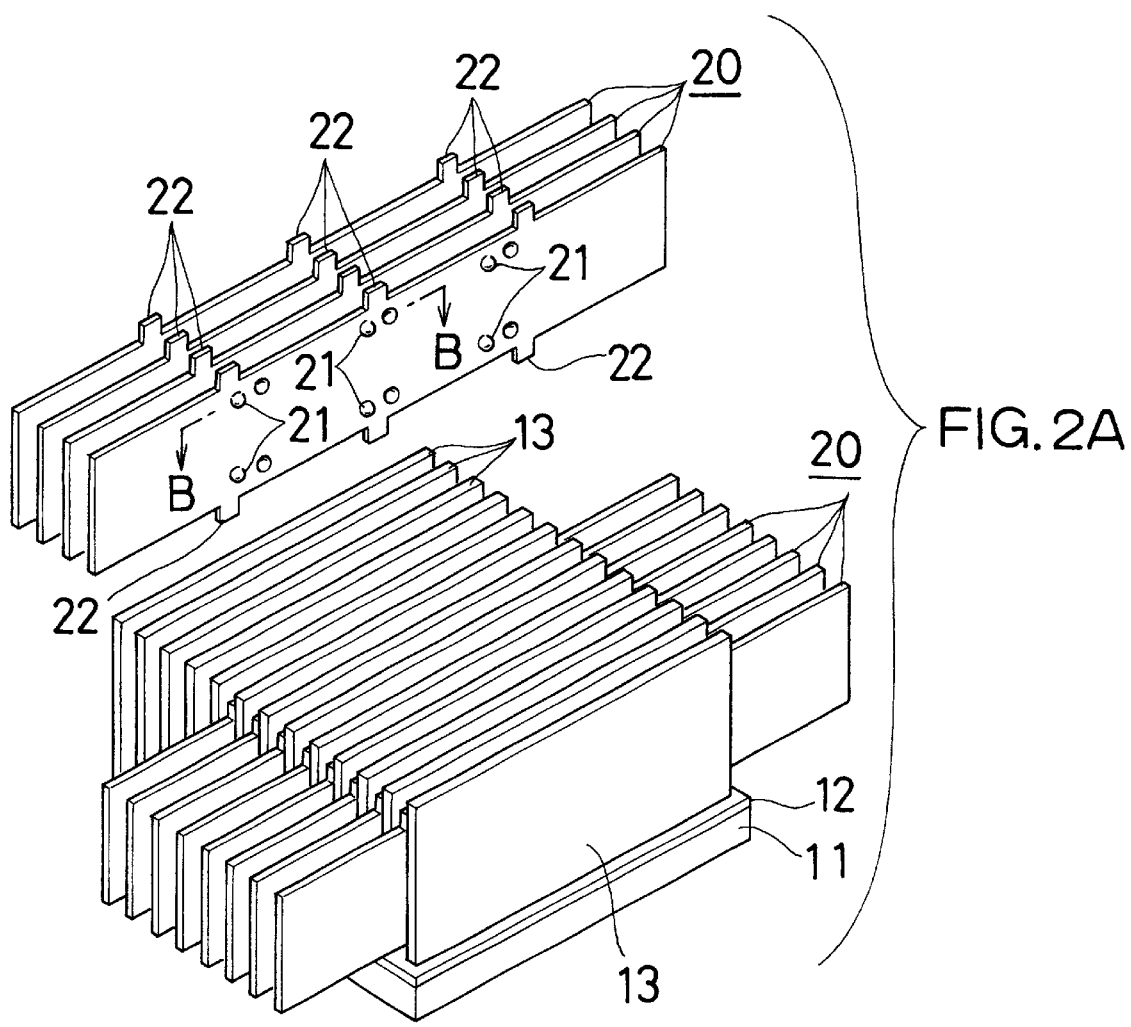
FIG. 2B is an enlarged cross sectional view taken along the line B—B of the spacer plate in FIG. 2A.
Figure 2B:
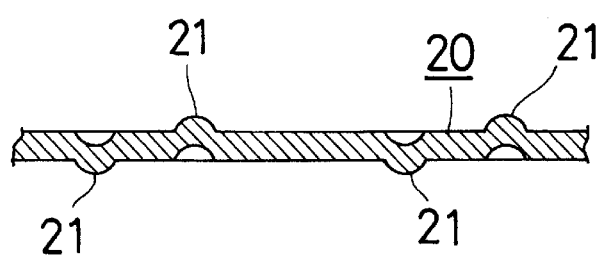

FIG. 2A and FIG. 2B show an example of a spacer plate 20 and an example of assembling the heat sink. The spacer plate 20 has a plurality of semi-spherical small protrusions 21 formed on upper and lower portions on both surfaces, respectively, and the plate thickness including the small protrusions 21 corresponds to the distance of the fins 13. Further, legs 22 are protruded on both upper and lower ends. Then, when the heat dissipating substrate 11 and the fins 13 are assembled, the spacer plate 20 interposed between each of the fins 13 is in contact at the top ends of the small protrusions 21 with the fins 13 and in contact at the top ends of the legs 22 with the heat dissipating substrate 11 thereby enabling to hold the distance between the fins 13 exactly. Further, since the area of contact between the fin 13 and the spacer plate 20 and the area of contact between the heat dissipating substrate 11 and the spacer plate 20 are small, respectively, the spacer plate 20 can be taken out easily after brazing.

For the method of supplying the brazing material, a method of supplying the same on the fin joining surface of the heat dissipating substrate entirely and then assembling the fins is recommended since the brazing material can be supplied easily irrespective of the number of the fins and the distance of the fins, and the heat dissipating substrate and the fins can be assembled easily. Specifically, there can be mentioned, for example, a method of stacking a brazing material 12 formed into a sheet-shape on the heat dissipating substrate 11 as shown in FIG. 1, a method of stacking a brazing sheet 15 having brazing material clad on both surfaces of a core material on the heat dissipating substrate 11, or a method of cladding the brazing material to the fin-assembling surface of the heat dissipating substrate as a core material.

As has been explained above, in the method of manufacturing a heat sink made of aluminum according to this invention by brazing a plurality of fins on a heat dissipating substrate, the fin is constituted with an Al—Mg—Si series alloy comprising from 0.3 to 0.7% by weight of Mg, from 0.3 to 0.7% by weight of Si, and the balance of Al and inevitable impurities, and cooling is conducted at a rate of 50° C./min or higher within a range from 450–500° C. to 300° C. in the cooling process after heating for brazing and, subsequently, artificial aging is applied at 100 to 250° C., so that it is possible to obtain a heat sink having excellent heat dissipation performance due to the Al—Mg—Si series alloy composition as the material for the fins, having excellent strength of fins by rapid cooling and artificial aging after heating for brazing, and having both excellent heat dissipation performance and high strength.

Further, since high strength of the fins can be attained, the thickness of the fin can be reduced, so that the distance between the fins can be reduced than usual to increase the number of the fins thereby enlarging the heat dissipation area per unit of the heat dissipating substrate to further improve the heat dissipating performance as the heat sink.

EXAMPLE

Then, a method of manufacturing a heat sink made of aluminum according to this invention is to be explained in details by way of concrete examples with reference to the drawings.

In this example, a heat sink 1, having a plurality of thin plate fins 13 joined by brazing to one surface of a thick heat dissipating substrate 11 was manufactured as shown in FIG. 1.

The plate fin 13 was manufactured by casting a slab of 1,200 mm width×200 mm thick at each of compositions shown in Table 1, starting hot rolling at 530° C., further applying cold rolling finally into a thin flat plate of 0.5 mm thickness and cutting the plate to a required size by an ordinary method. Further, a flat plate of 5 mm thickness comprising JIS (Japanese Industrial Standards) 6063 Al alloy was manufactured as a heat dissipating substrate 11 and a sheet of 0.15 mm thickness comprising JIS 4343 Al alloy was manufactured as the brazing material 12 by an ordinary method and each being cut into required size. The thus manufactured fins, heat dissipating substrate and the brazing sheet 13 were cleaned and dried respectively.

After coating a chloride series flux comprising NaCl—KCl—LiCl—LiF—$ZnCl_2$ on both surfaces of the brazing material sheet 12, the brazing material sheet 12 was stacked on the heat dissipating substrate 11 and, further thereon, a plurality of plate fins 13 were assembled vertically each at a predetermined distance in parallel as shown in FIG. 1. The assembly was brazed by heating in a heating zone of a continuous brazing furnace in an N2 gas atmosphere at a temperature of the assembly from 590 to 600° C. for 10 minutes and then rapidly cooled in a cooling zone at a cooling rate shown in Table 1 in a range of 480° C. to 300° C. Then, after cooling the brazed heat sink to a normal temperature at the outside the furnace, residual flux was cleaned and removed, artificial aging was applied at the temperature and time shown in Table 1 in an aging furnace and, subsequently, cooled to a normal temperature at the outside the furnace.

For the heat sink 1 after brazing, tensile strength, thermal conductivity of the fins, and the thermal resistance as the heat sink were measured.

The tensile strength was measured by cutting out a test specimen according to JIS Z2201 No. 5 from the plate fin 13 and by an Instron Tensile Test Apparatus in accordance with JIS Z2241. The thermal conductivity was measured by cutting out a test specimen from the plate fin 13 and by an ordinary method. Further, the thermal resistance was measured by attaching a heater to the heat dissipating substrate 11 and compulsorily air cooling the plate fins 13 by a blower. The results of these tests are shown in Table 1.

TABLE 1

| | Manufacturing method | | | | | Heat sink characteristics | | |
|---|---|---|---|---|---|---|---|---|
| | Fin chemical composition (% by weight) Balance: Al | | | | Cooling rate after brazing | Condition for aging treatment | Fin tensile strength | Fin thermal conductivity | Thermal resistance |
| | Mg | Si | Cu | Mn | (° C./min) | (° C. × hr) | (N/mm$^2$) | (W/(m · K)) | (K/W) |
| Example 1 | 0.45 | 0.52 | 0.22 | — | 120 | 185 × 10 | 235 | 221 | 0.075 |
| Example 2 | 0.51 | 0.46 | 0.12 | — | 65 | 200 × 10 | 217 | 215 | 0.075 |
| Example 3 | 0.55 | 0.45 | 0.21 | — | 215 | 190 × 10 | 243 | 212 | 0.075 |
| Comp. Example 1 | — | 0.15 | — | 1.02 | 30 | — | 163 | 165 | 0.077 |
| Comp. Example 2 | 0.48 | 0.55 | — | — | 40 | — | 130 | 216 | 0.075 |
| Comp. Example 3 | 0.43 | 0.53 | — | — | 200 | — | 170 | 155 | 0.078 |

From the result of Table 1, it was confirmed that high fin strength and excellent heat dissipation performance can be obtained by brazing fins formed of Al—Mg—Si series alloy of the predetermined composition to a heat dissipating substrate and then rapidly cooling the same under the predetermined condition and applying artificial aging.

Further, since high strength of the fins can be obtained, the thickness of the fins can be reduced and, accordingly, the distance between the fins can be decreased to increase the number of the fins, thereby enabling to enlarge the heat dissipation area per unit area of the heat dissipating substrate and improve the heat dissipation performance as the heat sink.

The present invention claims a priority based on Japanese Patent Application No. H11-83132 filed on Mar. 26, 1999, the content of which is incorporated hereinto by reference in its entirety.

The terms and descriptions in this specification are used only for explanatory purposes and the present invention is not limited to these, but many modifications and substitutions may be made without departing from the spirit of the scope of the present invention which is defined by the appended claims.

What is claimed is:

1. A method of manufacturing a heat sink made of aluminum by brazing a plurality of fins onto a heat dissipating substrate in which the fin is constituted with an Al—Mg—Si series alloy comprising 0.4 to 0.6% by weight of Mg, from 0.3 to 0.7% by weight of Si, and the balance of Al and inevitable impurities, and cooling is conducted at a rate of 50° C./min or higher within a range from 450–500° C. to 300° C. in the cooling process after heating for brazing, which is performed consecutively so that brazing and solution treatment are performed in the same heating cycle without additional cooling, and subsequently, applying artificial aging at 100–250° C. without performing a process of heating at a temperature higher than 250° C. after the cooling process.

2. A method of manufacturing a heat sink made of aluminum as defined in claim 1, wherein the Si content in the Al—Mg—Si series alloy constituting the fin is from 0.4 to 0.6% by weight.

3. A method of manufacturing a heat sink made of aluminum as defined in claim 1, wherein the cooling after heating for brazing is conducted at a rate of 75° C./min or more.

4. A method of manufacturing a heat sink made of aluminum as defined in claim 2, wherein the cooling after heating for brazing is conducted at a rate of 75° C./min or more.

5. A method of manufacturing a heat sink made of aluminum as defined in claim 1, wherein the artificial aging is conducted at a temperature from 160 to 220° C.

6. A method of manufacturing a heat sink made of aluminum as defined in claim 2, wherein the artificial aging is conducted at a temperature from 160 to 220° C.

7. A method of manufacturing a heat sink made of aluminum as defined in claim 3, wherein the artificial aging is conducted at a temperature from 160 to 220° C.

8. A method of manufacturing a heat sink made of aluminum as defined in claim 4, wherein the artificial aging is conducted at a temperature from 160 to 220° C.

9. A method of manufacturing a heat sink made of aluminum as defined in any one of claims 1, 2, 3, 4, 5, 6, 7 and 8, in which the heat dissipating substrate 11 and a plurality of fins 13 are brazed by using an Al—Si series alloy brazing material and a chloride series flux, and heating at 577° C. to 610° C. in an inert gas atmosphere.

* * * * *